(12) United States Patent
Lim et al.

(10) Patent No.: US 9,502,332 B2
(45) Date of Patent: Nov. 22, 2016

(54) NONVOLATILE MEMORY DEVICE AND A METHOD FOR FABRICATING THE SAME

(71) Applicant: SAMSUNG ELECTRONICS CO., LTD., Suwon-si, Gyeonggi-do (KR)

(72) Inventors: Jong-Heun Lim, Gyeonggi-do (KR); Hyo-Jung Kim, Seoul (KR); Ji-Woon Im, Gyeonggi-do (KR); Kyung-Hyun Kim, Seoul (KR)

(73) Assignee: SAMSUNG ELECTRONICS CO., LTD., Suwon-Si, Gyeonggi-Do (KR)

( * ) Notice: Subject to any disclaimer, the term of this patent is extended or adjusted under 35 U.S.C. 154(b) by 488 days.

(21) Appl. No.: 13/927,914

(22) Filed: Jun. 26, 2013

(65) Prior Publication Data

US 2014/0048945 A1 Feb. 20, 2014

(30) Foreign Application Priority Data

Aug. 20, 2012 (KR) ........................ 10-2012-0090784

(51) Int. Cl.
*H01L 23/48* (2006.01)
*H01L 23/52* (2006.01)
*H01L 29/40* (2006.01)
*H01L 27/115* (2006.01)

(52) U.S. Cl.
CPC ......... *H01L 23/48* (2013.01); *H01L 27/11575* (2013.01); *H01L 27/11582* (2013.01); *H01L 2924/0002* (2013.01)

(58) Field of Classification Search
CPC ............. H01L 23/48; H01L 27/11582; H01L 27/11575; H01L 2924/0002; H01L 2924/00
See application file for complete search history.

(56) References Cited

U.S. PATENT DOCUMENTS

| 7,952,136 | B2 | 5/2011 | Kito et al. | |
| 8,227,897 | B2 * | 7/2012 | Kim | H01L 23/5228 257/536 |
| 8,268,687 | B2 * | 9/2012 | Hyun | H01L 27/11551 257/301 |
| 8,338,882 | B2 * | 12/2012 | Tanaka | H01L 27/11578 257/324 |
| 8,822,287 | B2 * | 9/2014 | Kim | H01L 21/31053 438/261 |
| 8,957,471 | B2 * | 2/2015 | Fukuzumi | H01L 27/11565 257/220 |
| 9,099,347 | B2 * | 8/2015 | Yun | H01L 27/1157 |
| 2010/0254191 | A1 | 10/2010 | Son et al. | |
| 2011/0001182 | A1 | 1/2011 | Sato | |
| 2011/0018051 | A1 | 1/2011 | Kim et al. | |
| 2011/0108907 | A1 * | 5/2011 | Maeda | H01L 27/11573 257/324 |
| 2011/0227141 | A1 | 9/2011 | Jeong et al. | |
| 2011/0292731 | A1 | 12/2011 | Kim et al. | |

FOREIGN PATENT DOCUMENTS

KR 1020100133217 12/2010

* cited by examiner

*Primary Examiner* — Thanh Y Tran
(74) *Attorney, Agent, or Firm* — F. Chau & Associates, LLC

(57) ABSTRACT

A nonvolatile memory device including a substrate which includes a cell array region and a connection region, an electrode structure formed on the cell array region and the connection region and including a plurality of laminated electrodes, a first recess formed in the electrode structure on the connection region and disposed between the cell array region and a second recess formed in the electrode structure on the connection region, and a plurality of vertical wirings formed on the plurality of electrodes exposed by the first recess.

8 Claims, 14 Drawing Sheets

NONVOLATILE MEMORY DEVICE AND A METHOD FOR FABRICATING THE SAME

CROSS-REFERENCE TO RELATED APPLICATION

This application claims priority under 35 U.S.C. §119 to Korean Patent Application No. 10-2012-0090784, filed on Aug. 20, 2012 in the Korean Intellectual Property Office, the disclosure of which is incorporated by reference herein in its entirety.

BACKGROUND

1. Technical Field

The present inventive concept relates to a nonvolatile memory device and a method for fabricating the same, and more particularly to a three-dimensional (3D) flash memory device and a method for fabricating the same.

2. Discussion of the Related Art

A semiconductor memory device is an electronic data storage device that may be implemented using a semiconductor such as silicon (Si), germanium (Ge), gallium arsenide (GaAs), and indium phosphide (InP). The semiconductor memory device may be classified as a volatile memory device or a nonvolatile memory device.

The volatile memory device retains stored data as long as power supply is on, but when the power supply is off or interrupted the stored data is lost. The volatile memory device types may include static random access memory (SRAM), dynamic RAM (DRAM), and synchronous DRAM (SDRAM). The nonvolatile memory device can retain stored data even when not powered. The nonvolatile memory device types may include a flash memory device, a read only memory (ROM), a programmable ROM (PROM), an electrically programmable ROM (EPROM), an electrically erasable and programmable ROM (EEPROM), and a resistive memory (for example, a phase-change RAM (PRAM), a ferroelectric RAM (FRAM), and a resistive RAM (RRAM)).

To advance the degree of integration of a nonvolatile memory device, a three-dimensional memory device in which unit memory cells are vertically disposed has been developed.

SUMMARY

Exemplary embodiments of the present inventive concept provide a three-dimensional (3D) nonvolatile memory device having improved process stability.

Exemplary embodiments of the present inventive concept also provide a method for fabricating a 3D nonvolatile memory device having improved process stability.

According to an exemplary embodiment of the present inventive concept, there is provided a nonvolatile memory device comprising: a substrate which includes a cell array region and a connection region; an electrode structure formed on the cell array region and the connection region and including a plurality of laminated electrodes; a first recess formed in the electrode structure on the connection region and disposed between the cell array region and a second recess formed in the electrode structure on the connection region; and a plurality of vertical wirings formed on the plurality of electrodes exposed by the first recess.

The first recess includes a first side wall surface disposed on a first side of the first recess and a second side wall surface disposed on a second side of the first recess, and the second recess includes a third side wall surface disposed on a first side of the second recess and a fourth side wall surface disposed on a second side of the second recess.

The plurality of vertical wirings are formed on the first side wall surface, and the plurality of vertical wirings are not formed on the second side wall surface, the third side wall surface, and the fourth side wall surface.

The plurality of electrodes exposed by the first recess have a step shape.

The nonvolatile memory device further comprises a plurality of channel patterns that penetrate the electrode structure on the cell array region.

According to an exemplary embodiment of the present inventive concept, there is provided a nonvolatile memory device comprising: a substrate which includes a cell array region and a connection region; a mold pattern formed on the substrate and including a trench; a first electrode structure formed on a bottom and a side wall of the trench and an upper surface of the mold pattern, and including a plurality of first laminated electrodes; a second electrode structure formed on the first electrode structure and including a plurality of second laminated electrodes; a first recess formed in the second electrode structure on the connection region; a second recess formed in the second electrode structure on the connection region and disposed between the cell array region and the first recess; and a plurality of first vertical wirings formed on the plurality of second electrodes exposed by the second recess.

The second recess includes a first side wall surface disposed on a first side of the second recess and a second side wall surface disposed on a second side of the second recess, and the first recess includes a third side wall surface disposed on a first side of the first recess and a fourth side wall surface disposed on a second side of the first recess.

The plurality of first vertical wirings are formed on first side wall surface, and the plurality of first vertical wirings are not formed on the second side wall surface, the third side wall surface, and the fourth side wall surface.

The nonvolatile memory further comprises a third recess formed in the first electrode structure on the connection region.

The nonvolatile memory device further comprises a fourth recess formed in the first electrode structure on the connection region, wherein the third recess is disposed between the cell array region and the fourth recess.

The third recess includes a fifth side wall surface disposed on a first side of the third recess and a sixth side wall surface disposed on a second side of the third recess, and the fourth recess includes a seventh side wall surface disposed on a first side of the fourth recess and an eighth side wall surface disposed on a second side of the fourth recess, and a plurality of second vertical wirings are formed on the plurality of first electrodes exposed by the third recess at the fifth side wall surface, and the plurality of second vertical wirings are not formed on the sixth side wall surface, the seventh side wall surface, and the eighth side wall surface.

The third recess and the fourth recess are disposed on the upper surface of the mold pattern.

The third recess and the second recess are formed at the substantially same height and with substantially the same depth.

The second recess and the first recess are formed with substantially the same depth.

An upper surface of the first electrode structure and an upper surface of the second electrode structure are connected to each other.

According to an exemplary embodiment of the present inventive concept, there is provided a semiconductor memory device comprising: a first electrode structure formed on a substrate and including a plurality of electrodes; a first recess formed in the first electrode structure; a second recess formed in the first electrode structure adjacent to the first recess; and a plurality of vertical wirings formed on the electrodes in the first recess.

The second recess is a dummy recess. The electrodes include word lines. The electrodes have a step shape. The semiconductor memory device is a nonvolatile memory device.

BRIEF DESCRIPTION OF THE DRAWINGS

The above and other features of the present inventive concept will become more apparent by describing in detail exemplary embodiments thereof with reference to the accompanying drawings, in which.

DETAILED DESCRIPTION OF THE EMBODIMENTS

Exemplary embodiments of the present inventive concept will be described more fully hereinafter with reference to the accompanying drawings. The present inventive concept may, however, be embodied in many different forms and should not be construed as being limited to the embodiments set forth herein.

As used herein, the singular forms "a," "an" and "the" are intended to include the plural forms as well, unless the context clearly indicates otherwise.

Figure 1:
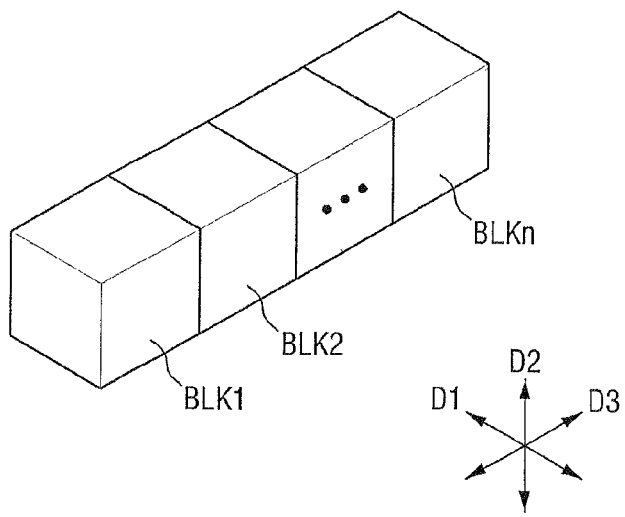
FIG. 1 is a diagram of a nonvolatile memory device according to an exemplary embodiment of the present inventive concept.

FIG. 1 is a diagram of a nonvolatile memory device according to an exemplary embodiment of the present inventive concept.

Referring to FIG. 1, a memory cell array of a nonvolatile memory device according to an exemplary embodiment of the present inventive concept may include a plurality of memory blocks BLK1 to BLKn (where, n is a natural number). The respective memory blocks BLK1 to BLKn may extend in first to third directions D1, D2, and D3. As illustrated, the first to third directions D1, D2, and D3 may be directions which cross one another, and may be different directions. For example, the first to third directions D1, D2, and D3 may be directions which cross one another at right angles, but are not limited thereto.

Figure 2:
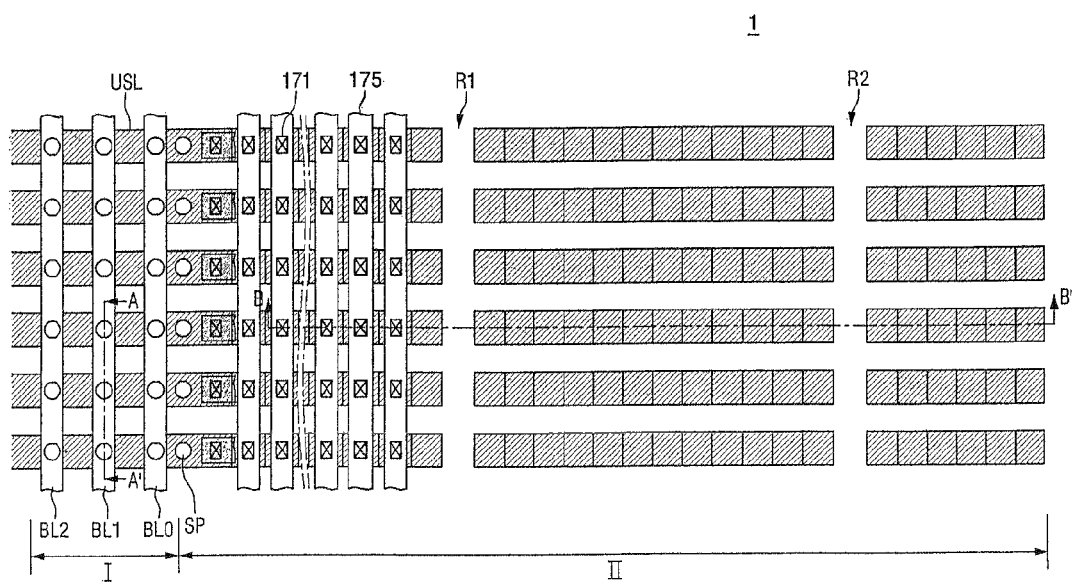
FIG. 2 is a layout diagram of a nonvolatile memory device according to an exemplary embodiment of the present inventive concept.
Figure 3:
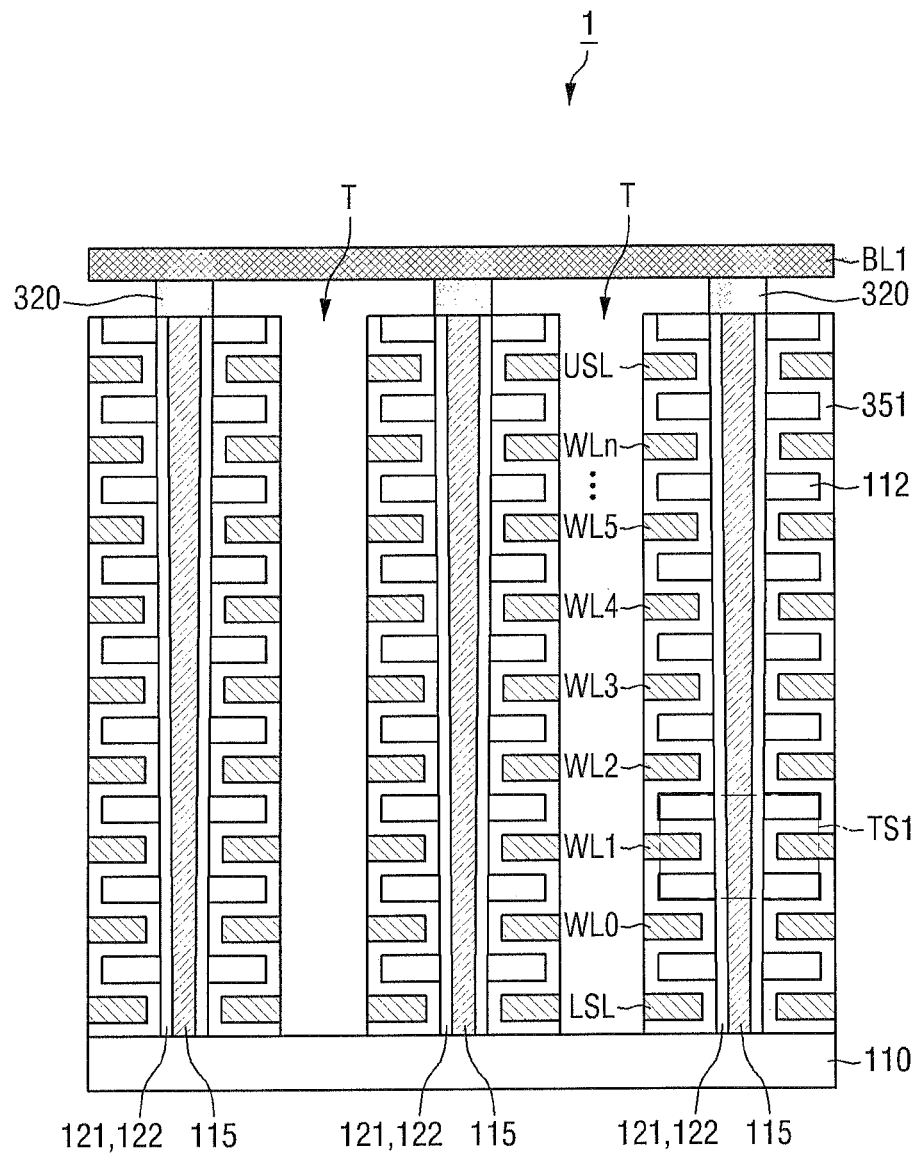
FIG. 3 is a cross-sectional view taken along line A-A of FIG. 2.
Figure 4:
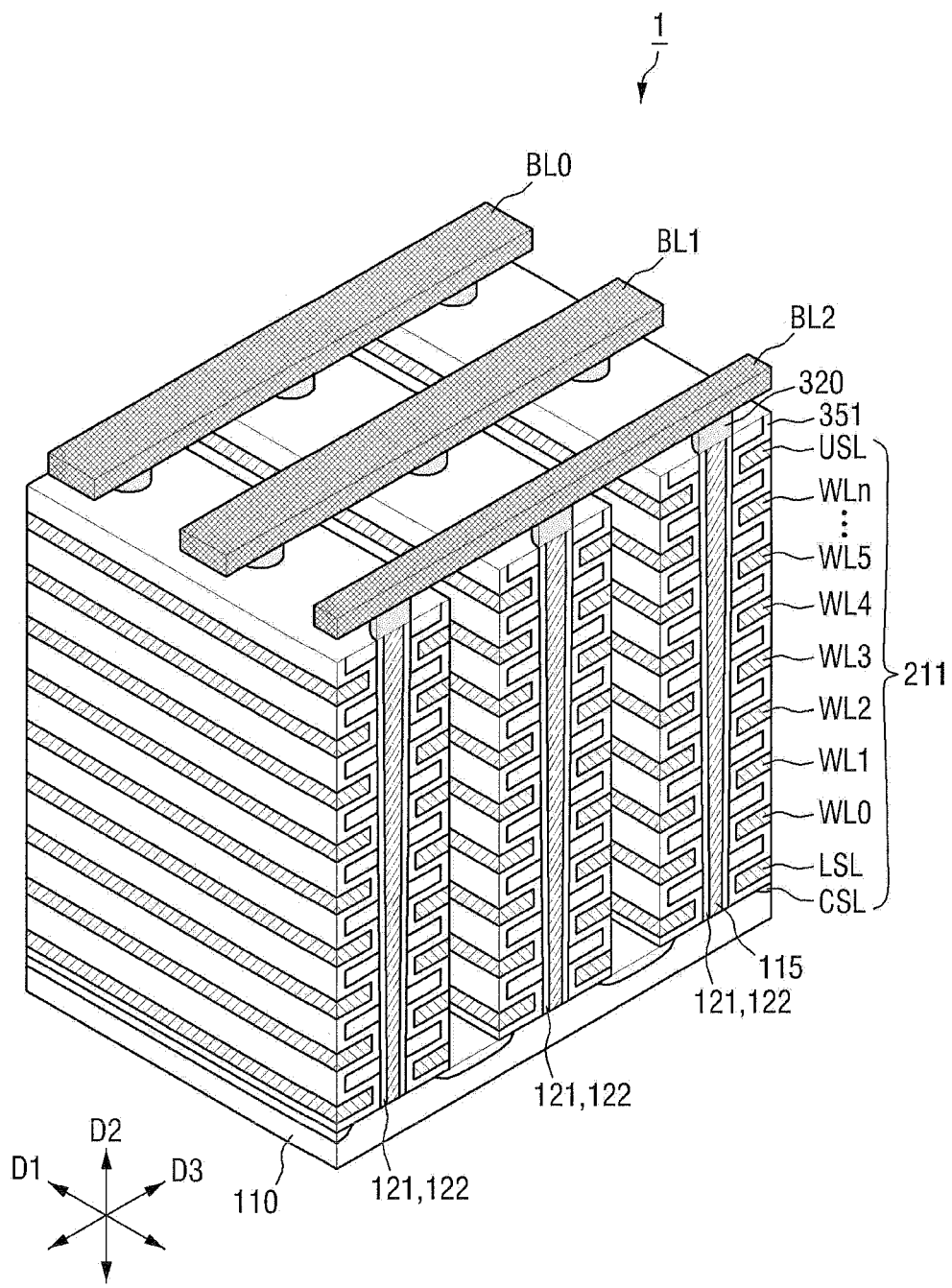
FIG. 4 is a perspective view of a cell array region I in FIG. 2.
Figure 5:
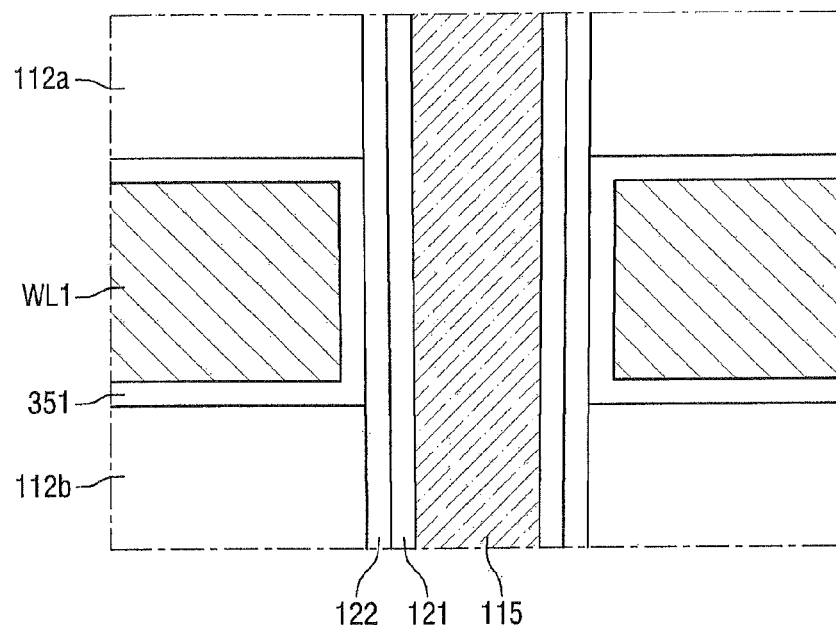
FIG. 5 is an enlarged view of a TS1 region in FIG. 3.
Figure 6:
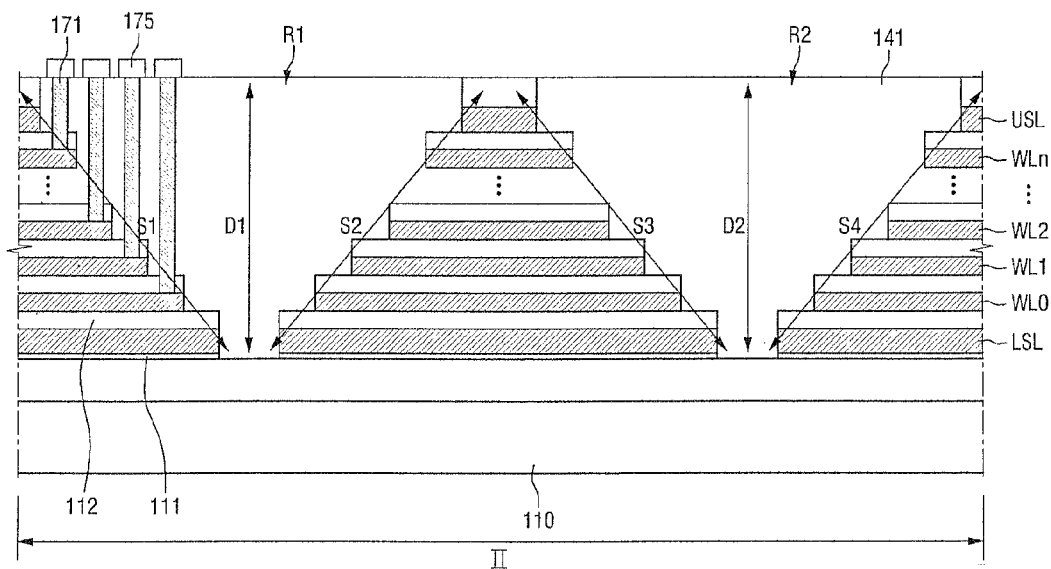
FIG. 6 is a cross-sectional view taken along line B-B of FIG. 2.

FIG. 2 is a layout diagram of a nonvolatile memory device according to an exemplary embodiment of the present inventive concept, and FIG. 3 is a cross-sectional view taken along line A-A of FIG. 2. FIG. 4 is a perspective view of a cell array region I in FIG. 2. FIG. 5 is an enlarged view of a TS1 region in FIG. 3. FIG. 6 is a cross-sectional view taken along line B-B of FIG. 2.

Referring to FIG. 2, in a nonvolatile memory device 1 according to an exemplary embodiment of the present inventive concept, a cell array region I and a connection region II are defined on a substrate 110.

The cell array region I is a region where a plurality of nonvolatile memory cells are formed, and the connection region II is a region that is disposed between the cell array region I and a peripheral circuit region (not illustrated). As described later, in the connection region II, a plurality of vertical wirings and pads for routing a plurality of laminated electrodes (in other words, word lines) are formed. Further, the connection region II may include a first recess region for connecting a plurality of gate electrodes, vertical wirings, and pads and a second recess region for stable processing.

Referring to FIGS. 2 to 5, the cell array region I will be first described.

In the cell array region I of the substrate 110, a plurality of insulating patterns 112, first electrodes LSL, WL0 to WLn, and USL (where, n is a natural number), channel patterns 115, tunnel layers 121, trap layers 122, block layers 351, and bit lines BL0 to BL2 are formed.

The plurality of insulating patterns 112 may be sequentially laminated on the substrate 110 to be spaced apart from each other in the second direction D2. As illustrated in FIG. 4, the respective insulating patterns 112 may be formed to extend lengthwise in the first direction D1. The insulating patterns 112 may be made of, but are not limited to, oxide.

The plurality of first electrodes LSL, WL0 to WLn, and USL may be deposited between the plurality of insulating patterns 112. The plurality of first electrodes LSL, WL0 to WLn, and USL may be formed lengthwise in the first direction D1, and may be laminated in the second direction D2. The plurality of first electrodes LSL, WL0 to WLn, and USL as laminated above are called a first electrode structure 211.

A nonvolatile memory cell TS1 may be defined in a region where the plurality of channel patterns 115 and the plurality of first electrodes LSL, WL0 to WLn, and USL cross each other.

The plurality of channel patterns 115 are formed to extend lengthwise in the second direction D2, and the plurality of first electrodes LSL, WL0 to WLn, and USL are formed to extend lengthwise in the first direction D1. Specifically, the plurality of channel patterns 115 are disposed on the substrate 110 in the form of pillars, and are formed to penetrate the plurality of laminated insulating patterns 112. The plurality of first electrodes LSL, WL0 to WLn, and USL may be formed between the plurality of laminated insulating patterns 112. The plurality of first electrodes LSL, WL0 to WLn, and USL may be formed to cross the plurality of channel patterns 115. Although it is illustrated that the plurality of first electrodes LSL, WL0 to WLn, and USL have the same thickness, they may have different thicknesses from each other.

For example, the plurality of channel patterns 115 may be made of, but are not limited to, a semiconductor material such as single crystalline silicon. The plurality of first electrodes LSL, WL0 to WLn, and USL may be formed of a conductive material, and for example, may be formed of, but are not limited to, a conductive material, such as tungsten (W), cobalt (Co), and nickel (Ni), or a semiconductor material such as silicon.

The tunnel layers 121 and the trap layers 122 may be formed on side walls of the channel patterns 115. The tunnel layers 1.21 and the trap layers 122 may be disposed between the first electrodes LSL, WL0 to WLn, and USL and the channel patterns 115. Specifically, for example, the tunnel layers 121 and the trap layers 122 may be formed to penetrate the plurality of insulating patterns 112 along the channel patterns 115.

The tunnel layer 121 is a portion through which a charge passes, and for example, may be formed of a silicon oxide film or a double layer composed of a silicon oxide film and a silicon nitride film.

The trap layer 122 is a portion in which a charge that has passed through the tunnel layer 121 is stored. For example, the trap layer 122 may be formed of a nitride film or a high-k film. The nitride film may include, for example, at least one of silicon nitride, silicon oxynitride, hafnium oxynitride, zirconium oxynitride, hafnium silicon oxynitride, and hafnium aluminum oxynitride. The high-k film may include, for example, at least one of hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate.

Further, a block layer 351 may be disposed between the plurality of channel patterns 115 and the plurality of first electrodes LSL, WL0 to WLn, and USL. The block layer 351 may be formed to extend lengthwise in the first direction D1. Further, the block layer 351 may be formed in a zigzag manner in the second direction D2.

As illustrated in FIG. 5, the block layer 351 may be formed between the insulating pattern (112a in FIG. 5) disposed on an upper side and the electrode (WL1 in FIG. 5), between the insulating pattern (112b in FIG. 5) disposed on a lower side and the electrode WL1, and between the channel pattern 115 (or trap layer 122) and the electrode WL1. In other words, the block layer 351 may be conformally formed depending on the shapes of the insulating patterns 112a and 112b and the channel pattern 115.

The block layer 351 may be a single layer or a multilayer. The block layer 351 may include silicon oxide or an insulating metal oxide having a higher dielectric constant than the silicon oxide. For example, the block layer 351 may be formed of a multi-layer that is laminated by a high-k material, such as aluminum oxide, hafnium oxide, lanthanum oxide, tantalum oxide, titanium oxide, lanthanum hafnium oxide, lanthanum aluminum oxide, or dysprosium scandium oxide, or a combination thereof.

The configuration of the tunnel layer 121, the trap layer 122, and the block layer 351 as illustrated in FIG. 5 is merely exemplary. For example, the tunnel layer 121, the trap layer 122, and the block layer 351 may be disposed along the lengthwise direction of the channel pattern 115.

On the other hand, as illustrated in FIGS. 3 and 4, the plurality of channel patterns 115 may be disposed to be separate from each other in the first direction D1 and in the third direction D3. In other words, the plurality of channel patterns 115 may be disposed in a matrix form. In FIGS. 3 and 4, the plurality of channel patterns 115 are illustrated to be disposed 3×3, but are not limited thereto.

In the substrate 110, a common source line CSL may be formed lengthwise along the first direction D1.

Separation spaces T may be formed in the plurality of channel patterns 115 disposed in the third direction D3. The plurality of channel patterns 115 disposed in the third direction D3 may be electrically connected with each other by the bit lines BL0 to BL2.

Referring again to FIGS. 2 and 6, the connection region II will be described.

In the connection region II, the plurality of first electrodes LSL, WL0 to WLn, and USL (in other words, the first electrode structure 211), the plurality of insulating patterns 112, a first recess R1, a second recess R2, a plurality of vertical wirings 171, a plurality of connection pads 175, a plurality of supports SP, and interlayer insulating film 141 may be formed.

As illustrated, the plurality of first electrodes LSL, WL0 to WLn, and USL, and the plurality of insulating patterns 112 may extend from the cell array region I.

The interlayer insulating film 141 may be formed to fill the first recess R1 and the second recess R2 therewith. The interlayer insulating film 141 may be formed of, but is not limited to, SiO2, SiN, SiON, or a low-k insulating film (for example, SiOF or SiOC).

The plurality of supports SP are provided to penetrate the plurality of first electrodes LSL, WL0 to WLn, and USL. The supports SP may be formed to extend from the substrate 110 to the upper side (in other words, extend in the second direction D2). The supports SP may be in a pillar shape formed of an insulating material. The supports SP may be formed to be spaced apart from the plurality of channel patterns 115.

On the other hand, the first recess R1 may be disposed between the cell array region I and the second recess R2. In other words, the first recess R1 may be disposed closer to the cell array region I than the second recess R2.

The plurality of first electrodes LSL, WL0 to WLn, and USL which are exposed by the first recess R1 and the second recess R2 may be in a step shape. In other words, the electrode disposed on the lower side (for example, WL1) may project further into the recesses R1 and R2 than the electrode disposed on the upper side (for example, WL2). The length of the electrode WL1 disposed on the lower side may be longer than the length of the electrode WL2 disposed on the upper side.

As illustrated, the first recess R1 may have a shape that becomes narrower as it goes from the upper side to the lower side.

The second recess R2 may also have a shape that becomes narrower as it goes from the upper side to the lower side. For example, the second recess R2 may have substantially the same shape as the first recess R1. In other words, the depth D2 of the second recess R2 may be substantially the same as the depth D1 of the first recess R1. The first recess R1 and the second recess R2 may be formed at the same height and with the same depth D1 or D2.

Here, the first recess R1 may be a real recess, and the second recess R2 may be a dummy recess.

Specifically, the first recess R1 includes a first side wall surface S1 and disposed on one side (for example, a left side) and a second side wall surface S2 disposed on the other side (for example, a right side). Further, the second recess R2 may include a third side wall surface S3 disposed on one side and a fourth side wall surface S4 disposed on the other side. The plurality of first electrodes LSL, WL0 to WLn, and USL, which are exposed by the first side wall surface S1, may be used, but the plurality of first electrodes LSL, WL0 to WLn, and USL which are exposed by the second side wall surface S2, the third side wall surface S3, and the fourth side wall surface S4, may not be used. In other words, the plurality of vertical wirings 171 are formed on the upper surfaces of the plurality of first electrodes LSL, WL0 to WLn, and USL exposed by the first side wall surface S1, but the plurality of vertical wirings 171 are not formed on the upper surfaces of the plurality of first electrodes LSL, WL0 to WLn, and USL exposed by the second side wall surface S2, the third side wall surface S3, and the fourth side wall surface S4. The plurality of connection pads 175 may be formed to be connected to the plurality of vertical wirings 171.

The reason why the second recess R2 is formed adjacent to the first recess R1 is as follows. To be described later, if the second recess R2 is not formed, the side wall surface S1 or S2 of the first recess R1 may fall down (e.g., collapse) during a planarization process. However, if the second recess R2 is disposed adjacent to the first recess R1, the side wall surface S3 or S4 of the second recess R2, rather than the sidewall surfaces of the first recess R1, may fall down during the planarization process. Thus, the side wall surface S1 or S2 of the first recess R1 may not fall down. In other words, by sacrificing the second recess R2, the first recess R1 for forming the plurality of vertical wirings 171 can be protected. In this way, process stability can be improved in fabricating a three-dimensional (3D) nonvolatile memory device.

The unexplained reference numeral 111 may be a buffer oxide film.

Figure 7:
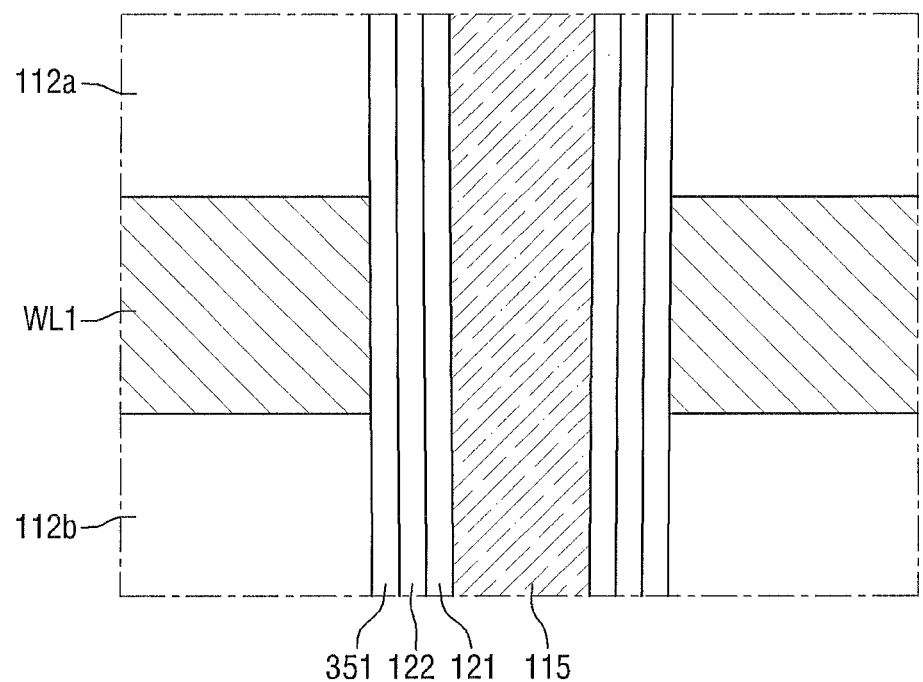
FIG. 7 is a cross-sectional view of a nonvolatile memory device according to an exemplary embodiment of the present inventive concept.

FIG. 7 is a cross-sectional view of a nonvolatile memory device according to an exemplary embodiment of the present inventive concept. FIG. 7 may be used in replacement of the nonvolatile memory cell TS1 illustrated in FIG. 5. For convenience, a portion of FIG. 7 that is different from FIG. 5 will be explained.

Referring to FIG. 7, in a nonvolatile memory device according to the current embodiment of the present inventive concept, the tunnel layers 121, the trap layers 122, and the block layers 351 may be formed on the side walls of the channel patterns 115. The tunnel layers 121, the trap layers 122, and the block layers 351 may be disposed along the lengthwise direction of the channel patterns 115. More specifically, the tunnel layers 121, the trap layers 122, and the block layers 351 may be formed to penetrate the plurality of insulating patterns 112 along the channel patterns 115.

Figure 8:
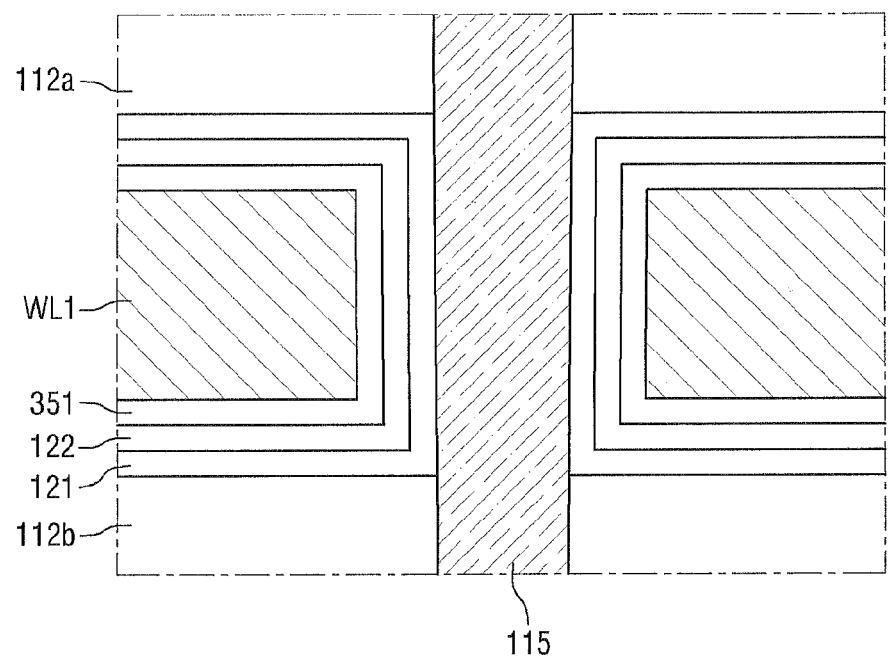
FIG. 8 is a cross-sectional view of a nonvolatile memory device according to an exemplary embodiment of the present inventive concept.

FIG. 8 is a cross-sectional view of a nonvolatile memory device according to an exemplary embodiment of the present inventive concept. FIG. 8 may be used in replacement of the nonvolatile memory cell TS1 illustrated in FIG. 5. For convenience, a portion of FIG. 8 that is different from FIG. 5 will be explained.

Referring to FIG. 8, in a nonvolatile memory device according to the current embodiment of the present inventive concept, the tunnel layers 121, the trap layers 122, and the block layers 351 may be formed between the insulating pattern 112a disposed on the upper side and the electrode WL1, between the insulating pattern 112b disposed on the lower side and the electrode WL1, and between the channel pattern 115 (or trap layer 122) and the electrode WL1. In other words, the block layer 351 may be conformally formed depending on the shapes of the insulating patterns 112a and 112b and the channel pattern 115.

Figure 9:
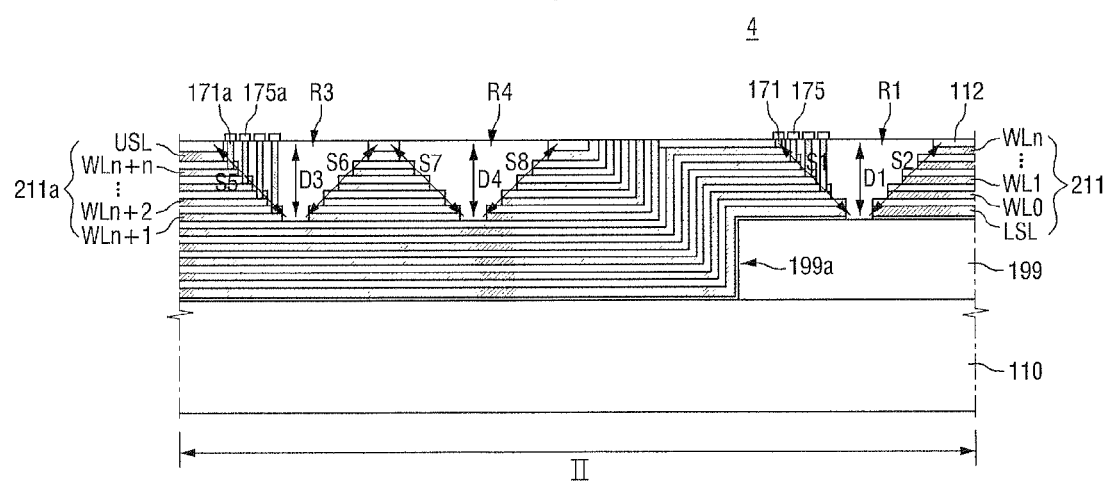
FIG. 9 is a cross-sectional view of a nonvolatile memory device according to an exemplary embodiment of the present inventive concept.

FIG. 9 is a cross-sectional view of a nonvolatile memory device according to an exemplary embodiment of the present inventive concept. For convenience, a portion of FIG. 9 that is different from the portion already explained using FIGS. 1 to 6 will be explained.

Referring to FIG. 9, a nonvolatile memory device 4 according to the current embodiment of the present inventive concept may include a mold pattern 199, a first electrode structure 211, a second electrode structure 211a, a first recess R1, a third recess R3, and a fourth recess R4.

The mold pattern 199 is formed on the substrate 110, and includes a trench 199a. For example, the mold pattern 199 may include, but is not limited to, at least one of SiO2, SiN, SiON, and a low-k insulating film.

The first electrode structure 211 may include a plurality of first laminated electrodes LSL and WL0 to WLn. A plurality of insulating patterns 112 may be disposed between the plurality of first electrodes LSL and WL0 to WLn. The first electrode structure 211 may be formed along a bottom and a side wall of the trench 199a and an upper surface of the mold pattern 199.

The second electrode structure 211a may include a plurality of second laminated electrodes WLn+1 to WLn+n and USL. The plurality of insulating patterns 112 may be disposed between the plurality of second electrodes WLn+1 to WLn+n and USL. The second electrode structure 211a may be formed on an upper surface of the first electrode structure 211. Here, it is illustrated that the number of the plurality of first laminated electrodes LSL and WL0 to WLn and the number of the plurality of second laminated electrodes WLn+1 to WLn+n and USL are equal to each other, but the numbers of the respective electrodes are not limited thereto.

On the other hand, the first electrode structure 211 and the second electrode structure 211a may extend from the cell array region I. In other words, in the cell array region I, a nonvolatile memory cell may be defined in the first electrode structure 211 and the second electrode structure 211a. In the cell array region I, a plurality of channel patterns (not illustrated) that cross the first electrode structure 211 and the second electrode structure 211a may be formed.

Further, as illustrated in FIG. 9, the upper surface of the first electrode structure 211 and the uppermost surface of the second electrode structure 211a may be connected to each other.

The first recess R1 may be formed in the first electrode structure 211. The first recess R1 may be disposed on the upper surface of the mold pattern 199. The third recess R3 may be formed in the second electrode structure 211a. The fourth recess R4 may be disposed between the first recess R1 and the third recess R3. In other words, the third recess R3 may be disposed between the cell array region I and the fourth recess R4. In other words, the third recess R3 may be disposed closer to the cell array region I than the fourth recess R4.

The plurality of first electrodes LSL and WL0 to WLn and the plurality of second electrodes WLn+1 to WLn+n and USL, which are exposed by the first recess R1, the third recess R3, and the fourth recess R4, may be in a step shape. For example, the electrode disposed on the lower side (for example, WL1) may project further into the recess R1 than the electrode disposed on the upper side (for example, WL2). The length of the electrode WL1 disposed on the lower side may be longer than the length of the electrode WL2 disposed on the upper side.

As illustrated in FIG. 9, the first recess R1, the third recess R3, and the fourth recess R4 may have a shape that becomes narrower as they go from the upper side to the lower side. For example, the first recess R1, the third recess R3, and the fourth recess R4 may have substantially the same shape. In other words, the depth D1 of the first recess R1, the depth D3 of the third recess R3, and the depth D4 of the fourth recess R4 may be substantially equal to each other. The first recess R1, the third recess R3, and the fourth recess R4 may be formed at the same height and with the same depth D1, D3, or D4.

Here, the first recess R1 and the third recess R3 may be real recesses, and the second recess R2 may be a dummy recess.

Specifically, the first recess R1 includes a first side wall surface S1 disposed on one side (for example, a left side) and a second side wall surface S2 disposed on the other side (for example, a right side). Further, the third recess R3 may include a fifth side wall surface S5 disposed on one side and a sixth side wall surface S6 disposed on the other side. The fourth recess R4 may include a seventh side wall surface S7 disposed on one side and an eighth side wall surface S8 disposed on the other side.

The plurality of first electrodes LSL and WL0 to WLn, which are exposed by the first side wall surface S 1, and the plurality of second electrodes WLn+1 to WLn+n and USL, which are exposed by the fifth side wall surface S5, may be used. The plurality of first electrodes LSL and WL0 to WLn, which are exposed by the second side wall surface S2, and the plurality of second electrodes WLn+1 to WLn+n and USL, which are exposed by the sixth side wall surface S6, the seventh side wall surface S7, and the eighth side wall surface S8, may not be used. In other words, a plurality of vertical wirings 171 and 171a are formed on the upper surfaces of the plurality of first electrodes LSL and WL0 to WLn exposed by the first side wall surface Si and the plurality of second electrodes WLn+1 to WLn+n and USL exposed by the fifth side wall surface S5. A plurality of connection pads 175 and 175a may be formed to be connected to the plurality of vertical wirings 171 and 171a.

The reason why the fourth recess R4 is formed adjacent to the third recess R3 is as follows. To be described later, if the fourth recess R4 is not formed, the side wall surface S5 or S6 of the third recess R3 may fall down (e.g., collapse) during a planarization process. However, if the fourth recess R4 is disposed adjacent to the third recess R3, the side wall surface S7 or S8 of the fourth recess R4, rather than the sidewall surfaces of the third recess R3, may fall down during the planarization process. Thus, the side wall surface S5 or S6 of the third recess R3 may not fall down. In other words, by sacrificing the fourth recess R4, the third recess R3 for forming the plurality of vertical wirings 171a can be protected. In this way, process stability can be improved in fabricating a 3D nonvolatile memory device.

Figure 10:
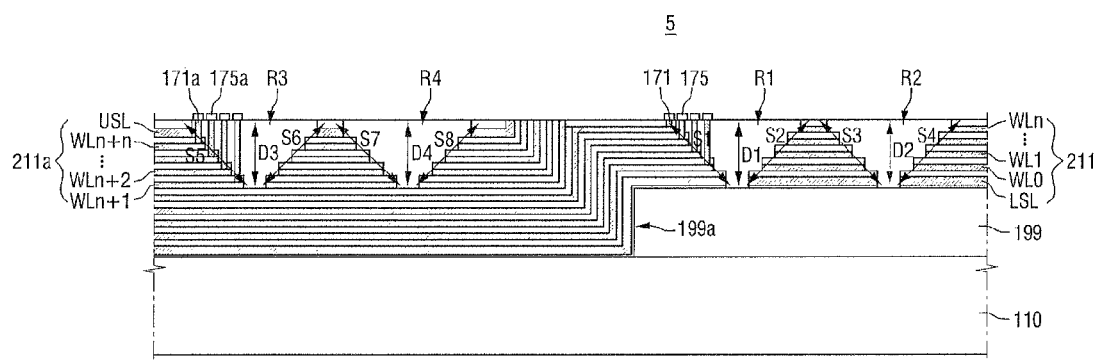
FIG. 10 is a cross-sectional view of a nonvolatile memory device according to an exemplary embodiment of the present inventive concept.

FIG. 10 is a cross-sectional view of a nonvolatile memory device according to an exemplary embodiment of the present inventive concept. For convenience, a portion of FIG. 10 that is different from FIG. 9 will be described.

Referring to FIG. 10, a nonvolatile memory device 5 according to the current embodiment of the present inventive concept may include a mold pattern 199, a first electrode structure 211, a second electrode structure 211a, a first recess R1, a second recess R2, a third recess R3, and a fourth recess R4.

The first recess R1 and the second recess R2 may be formed in the first electrode structure 211. The first recess R1 and the second recess R2 may be disposed on the upper surface of the mold pattern 199. The first recess R1 may be disposed between the cell array region I and the second recess R2. In other words, the first recess R1 may be disposed closer to the cell array region I than the second recess R4.

The plurality of first electrodes LSL and WL0 to WLn, which are exposed by the first recess R1 and the second recess R2, may be in a step shape. In other words, the electrode disposed on the lower side (for example, WL1) may project further into the recesses R1 and R2 than the electrode disposed on the upper side (for example, WL2).

The second recess R2 may have a shape that becomes narrower as it goes to the lower side. The first recess R1 and the second recess R2 may be formed at the same height and with the same depth D1 or D2. The second recess R2 may include a third side wall surface S3 disposed on one side and a fourth side wall surface S4 disposed on the other side.

By sacrificing the second recess R2, the first recess R1 for forming the plurality of vertical wirings 171 can be protected.

Figure 11:
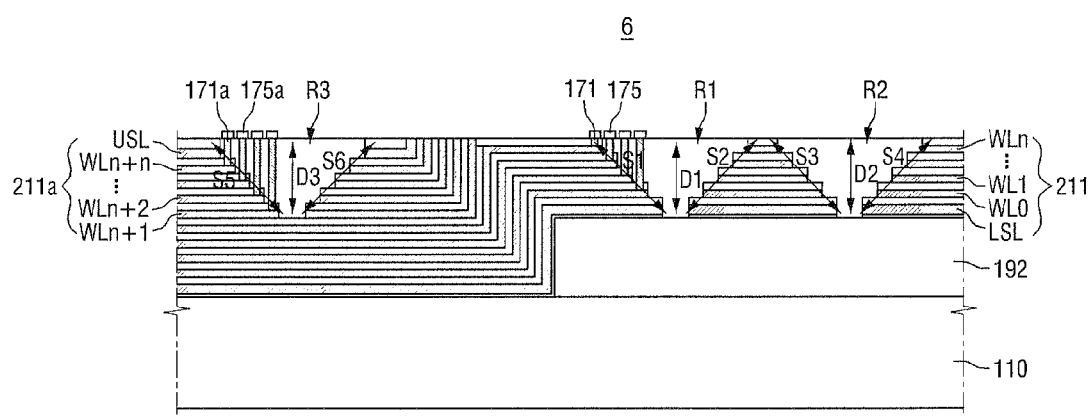
FIG. 11 is a cross-sectional view of a nonvolatile memory device according to an exemplary embodiment of the present inventive concept.

FIG. 11 is a cross-sectional view of a nonvolatile memory device according to an exemplary embodiment of the present inventive concept. For convenience, a portion of FIG. 11 that is different from FIG. 9 will be explained.

Referring to FIG. 11, a nonvolatile memory device 6 according to the current embodiment of the present inventive concept may include a mold pattern 192, a first electrode structure 211, a second electrode structure 211a, a first recess R1, a second recess R2, and a third recess R3. By sacrificing the second recess R2, the first recess R1 for forming the plurality of vertical wirings 171 can be protected.

Hereinafter, using FIGS. 12 to 17 and 9, a method for fabricating a nonvolatile memory device according to an exemplary embodiment of the present inventive concept will be described. FIGS. 12 to 17 are views of intermediate steps of the method for fabricating a nonvolatile memory device according to the current embodiment of the to present inventive concept.

Figure 12:
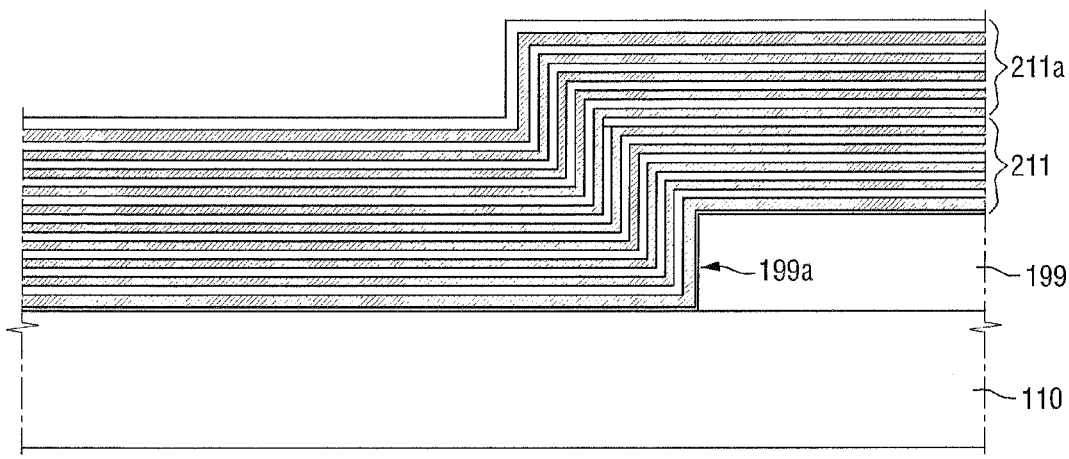
FIGS. 12 to 17 are views of intermediate steps of a method for fabricating a nonvolatile memory device according to an exemplary embodiment of the present inventive concept.

Referring to FIG. 12, a mold pattern 199 including a trench 199a is formed on a substrate 110.

Then, a first electrode structure 211 and a second electrode structure 211a are formed in order on the substrate 110. The first electrode structure 211 may be formed along a bottom and a side wall of the trench 199a and an upper surface of the mold pattern 199. The second electrode structure 211a may be formed on an upper surface of the first electrode structure 211. The first electrode structure 211 may include a plurality of first laminated electrodes LSL and WL0 to WLn. A plurality of insulating patterns 112 may be disposed between the plurality of first electrodes LSL and WL0 to WLn. The second electrode structure 211a may include a plurality of second laminated electrodes WLn+1 to WLn+n and USL. The plurality of insulating patterns 112 may be disposed between the plurality of second electrodes WLn+1 to WLn+n and USL.

Figure 13:
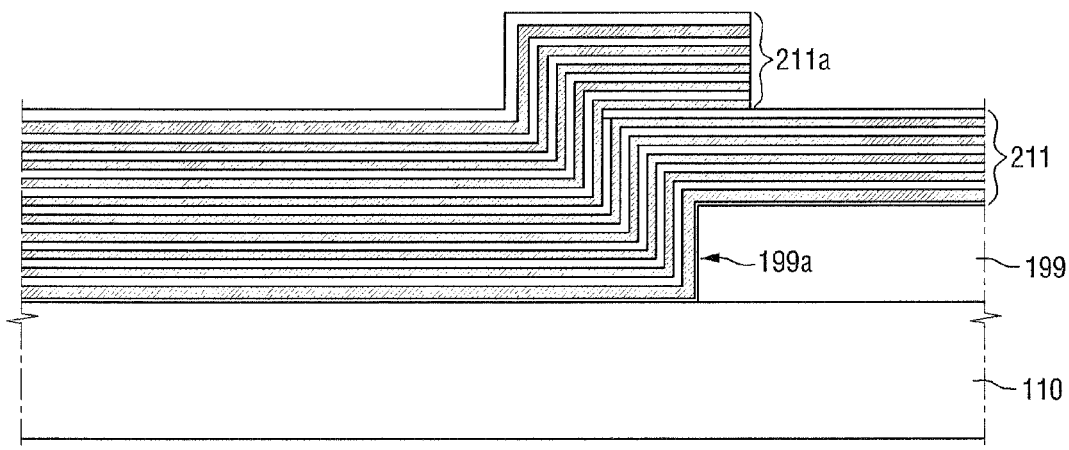

Referring to FIG. 13, a part of the second electrode structure 211a that is located on the mold pattern 199 is removed. Accordingly, a part of the first electrode structure 211 may be exposed.

Figure 14:
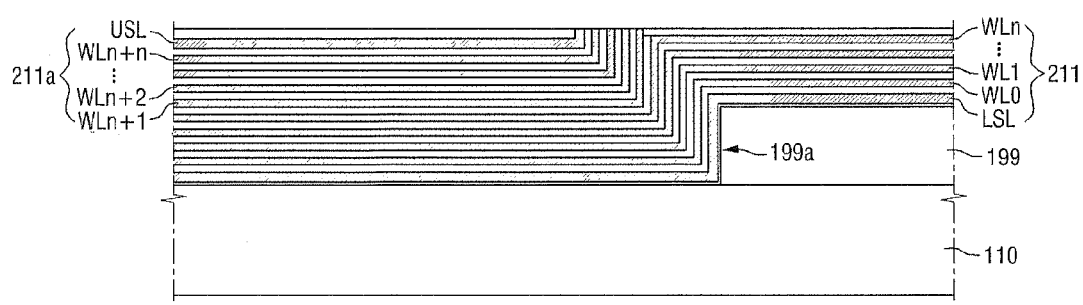

Referring to FIG. 14, a planarization process is performed. As a result, the uppermost surface of the first electrode structure 211 and the uppermost surface of the second electrode structure 211a may be connected to each other.

Figure 15:
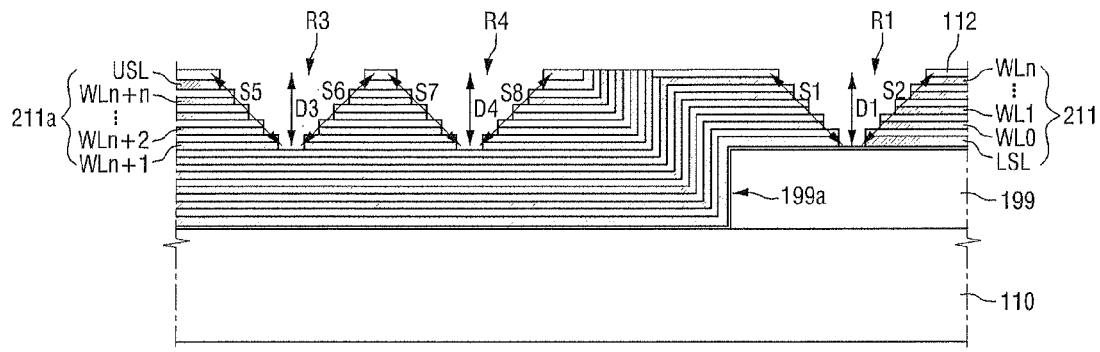

Referring to FIG. 15, the first recess R1 is formed in the first electrode structure 211, and the third recess R3 and the fourth recess R4 are formed in the second electrode structure 211a.

Specifically, the first recess R1 may be disposed on the upper surface of the mold pattern 199. The fourth recess R4 may be disposed between the first recess R1 and the third recess R3. In other words, the third recess R3 may be disposed between the cell array region I and the fourth recess R4. In other words, the third recess R3 may be disposed closer to the cell array region I than the fourth recess R4.

The plurality of first electrodes LSL and WL0 to WLn and the plurality of second electrodes WLn+1 to WLn+n and USL, which are exposed by the first recess R1, the third recess R3, and the fourth recess R4, may be in a step shape. For example, the electrode disposed on the lower side (for example, WL1) may project further into the recesses R1 and R2 than the electrode disposed on the upper side (for example, WL2).

A method for forming the first recess R1, the third recess R3, and the fourth recess R4 according to an exemplary embodiment of the present inventive concept will be described later with reference to FIGS. 18 to 21.

Figure 16:
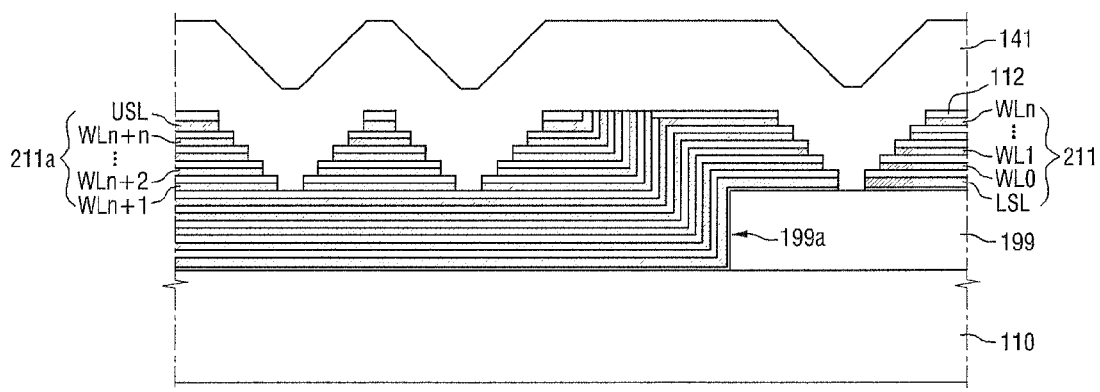

Referring to FIG. 16, an interlayer insulating film 141 is formed on the first electrode structure 211 and the second electrode structure 211a. The interlayer insulating film 141 may be conformally formed depending on the shapes of the first recess R1, the third recess R3, and the fourth recess R4, but the forming of the interlayer insulating film 141 is not limited thereto.

Figure 17:
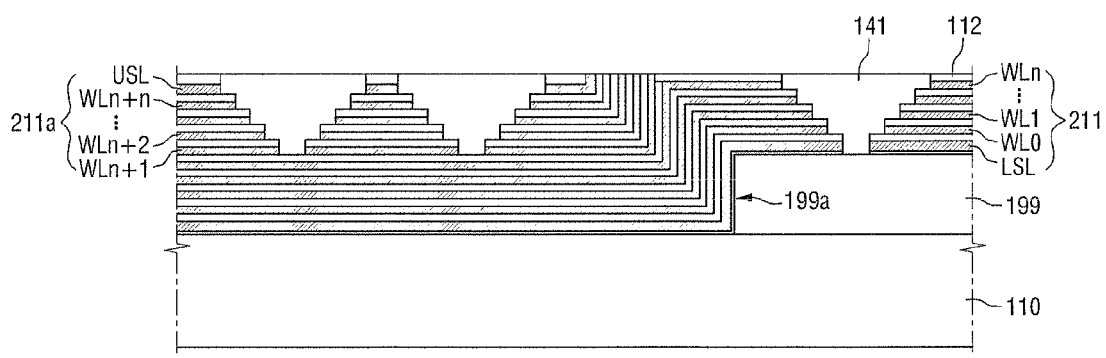

Referring to FIG. 17, a part of the interlayer insulating film 141 is removed through a planarization process. Through the planarization process, the upper surface of the first electrode structure 211 and the upper surface of the second electrode structure 211a may be exposed. The interlayer insulating film 141 may remain in the first recess R1, the third recess R3, and the fourth recess R4.

As described above, if the fourth recess R4 is disposed adjacent to the third recess R3, the side wall surface S7 or S8 of the fourth recess R4, rather than the sidewall surface of the third recess R3, may fall down (e.g., collapse) during the planarization process. Thus, the side wall surface S5 or S6 of the third recess R3 may not fall down. In other words, by sacrificing the fourth recess R4, the third recess R3 for forming the plurality of vertical wirings 171a can be protected. In this way, process stability can be improved in fabricating a 3D nonvolatile memory device.

Referring again to FIG. 9, a plurality of vertical wirings 171 and 171a are formed on the upper surfaces of the plurality of first electrodes LSL and WL0 to WLn exposed by the first side wall surface S1 and the plurality of second electrodes WLn+1 to WLn+n and USL exposed by the fifth side wall surface S5. A plurality of connection pads 175 and 175a may be formed to be connected to the plurality of vertical wirings 171 and 171a.

Referring to FIGS. 18 to 21, a recess forming step (see FIG. 15) will be described in detail. FIGS. 18 to 21 are views of intermediate steps of a recess forming step, according to an exemplary embodiment of the present inventive concept. FIGS. 18 to 21 show a process of forming the first recess R1.

Figure 18:
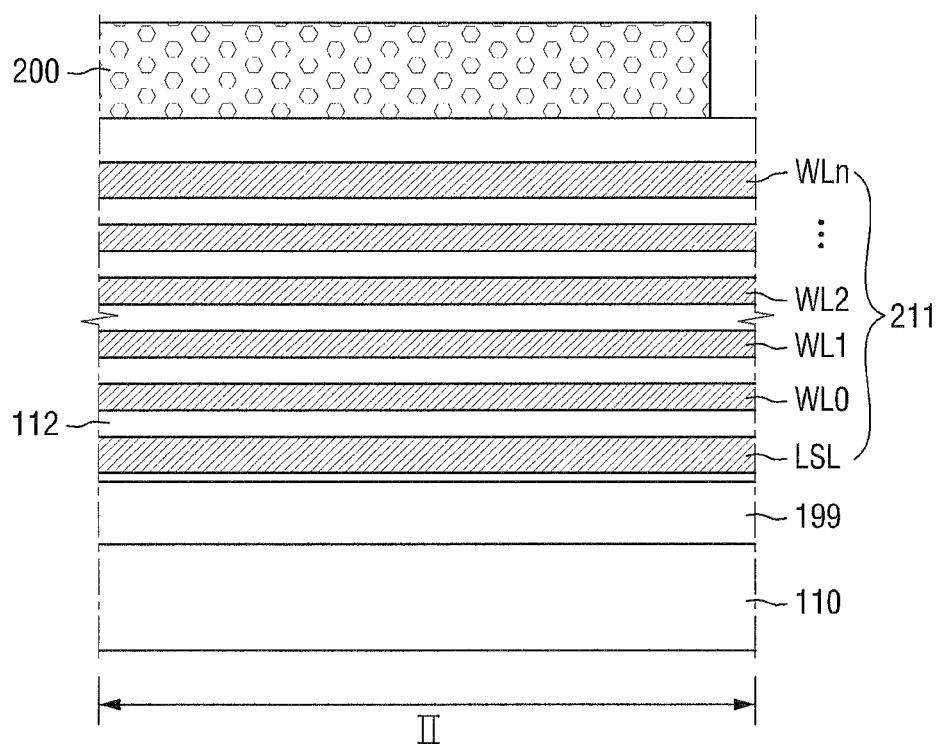
FIGS. 18 to 21 are views of intermediate steps of a recess forming step, according to an exemplary embodiment of the present inventive concept.

Referring to FIG. 18, the first electrode structure 211 is formed on the mold pattern 199. As described above, the first electrode structure 211 may include the plurality of first laminated electrodes LSL and WL0 to WLn. The plurality of insulating patterns 112 may be arranged between the plurality of first electrodes LSL and WL0 to WLn. The plurality of first electrodes LSL and WL0 to WLn and the insulating patterns 112 may have different wet etching characteristics.

A mask pattern 200 may be formed on the first electrode structure 211.

Figure 19:
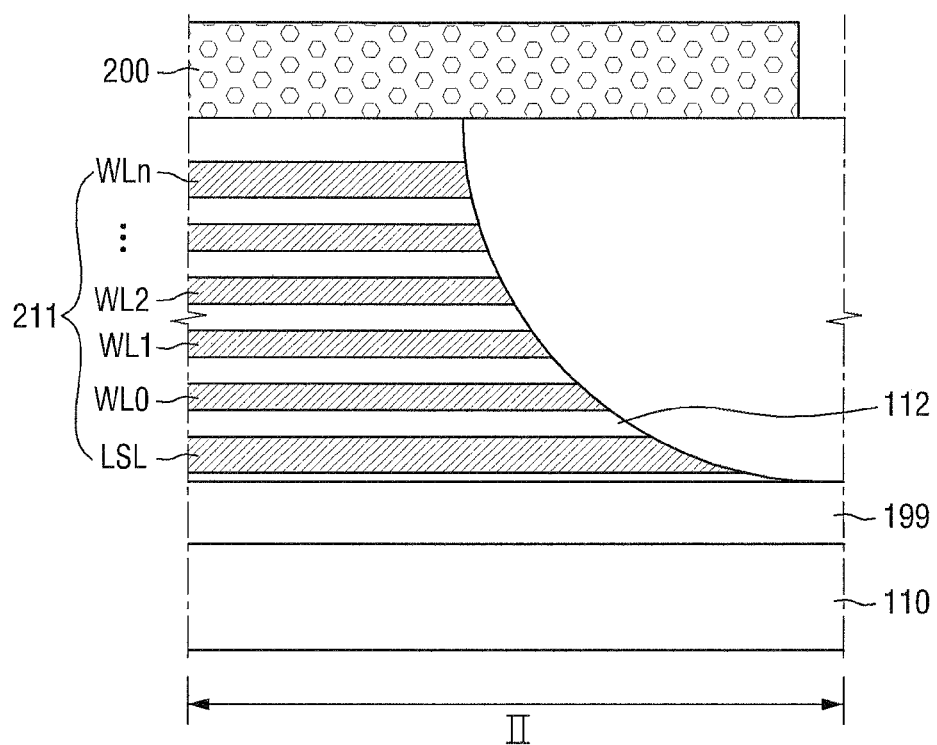

Referring to FIG. 19, a first etching process is performed using the mask pattern 200. As a result, a part of the region exposed by the mask pattern 200 may be isotropically etched by the mask pattern 200 as illustrated. In other words, the plurality of the first electrodes LSL and WL0 to WLn and the insulating patterns 112 may be isotropically etched to expose the substrate 110. The first etching process may be a wet etching process having the same etching rate with respect to the plurality of first electrodes LSL and WL0 to WLn and the insulating patterns 112. The etching rate may include a process error range.

Figure 20:
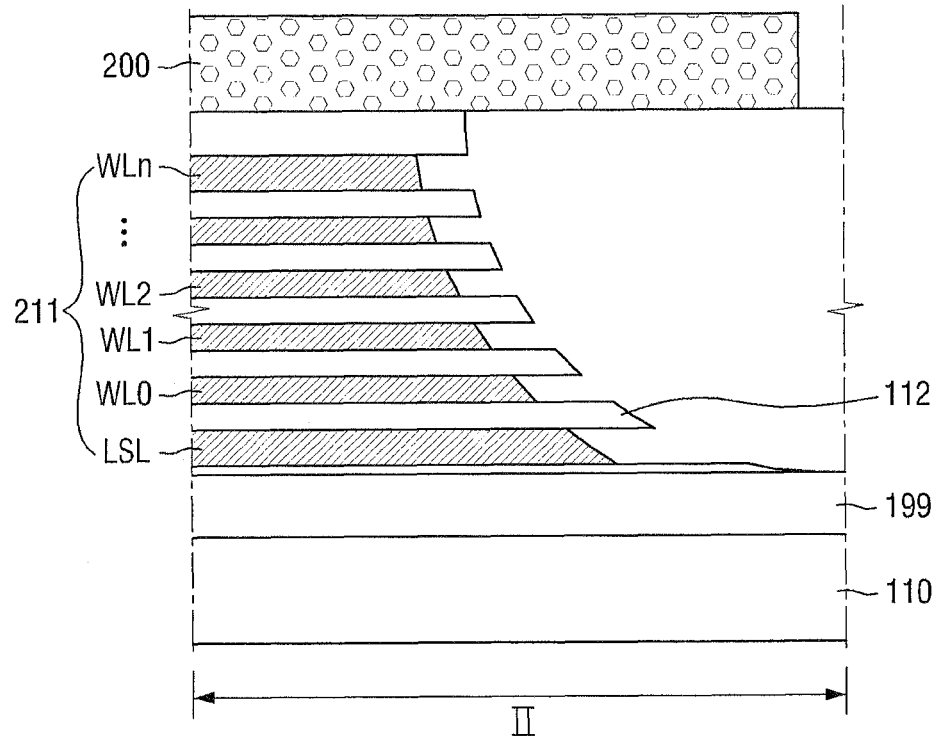

Referring to FIG. 20, a second etching process is performed. As a result, the plurality of first electrodes LSL and WL0 to WLn may be isotropically etched. The second etching process may include a wet etching process having a higher etch rate with respect to the plurality of first electrodes LSL and WL0 to WLn than the insulating patterns 112. In FIG. 20, it is illustrated that the insulating patterns 112 are not etched during the second etching process. In practice, however, a part of the insulating patterns 112 may be etched.

On the other hand, FIGS. 19 and 20 illustrate that the first etching process and the second etching process are continuously performed in order. However, the etching order is not limited thereto, and the first etching process and the second etching process may be simultaneously performed.

Figure 21:
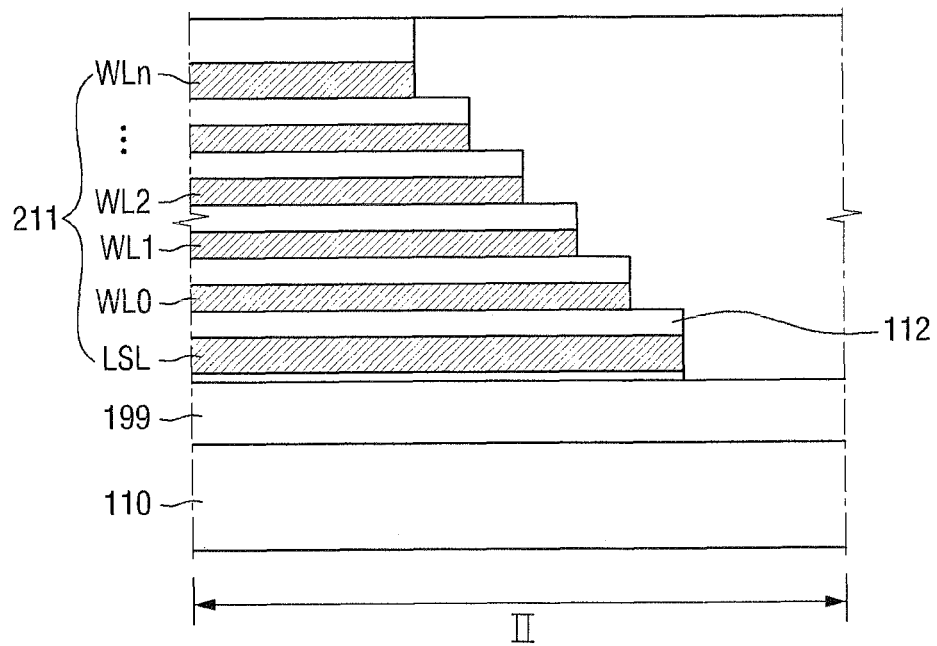

Referring to FIG. 21, the mask pattern 200 is removed.

Then, a third etching process is performed. The insulating patterns 112 may be anisotropically etched using the etched first electrodes LSL and WL0 to WLn as a mask. The third etching process may be an etch-back process.

As a result, the electrode disposed on the lower side (for example, WL1) may to project further into the recess R1 than the electrode disposed on the upper side (for example, WL2).

Figure 22:
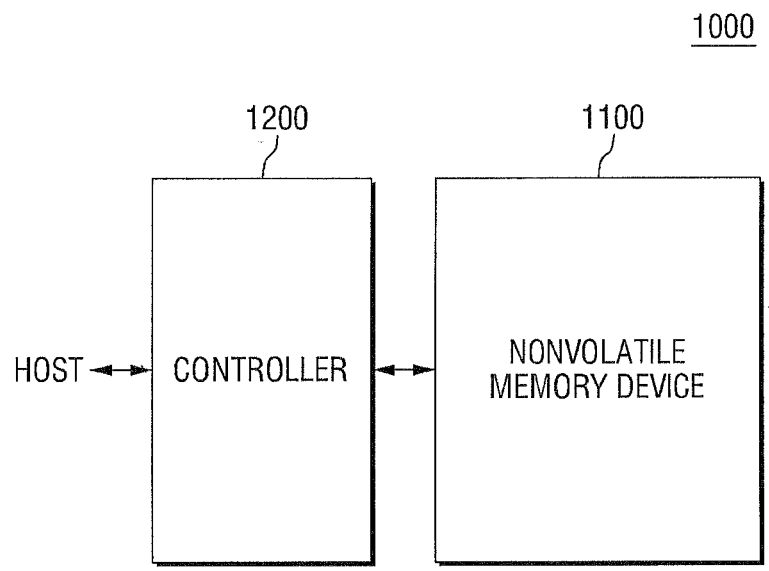
FIG. 22 is a block diagram illustrating a memory system according to an exemplary embodiment of the present inventive concept.

FIG. 22 is a block diagram illustrating a memory system according to an exemplary embodiment of the present inventive concept.

Referring to FIG. 22, a memory system 1000 includes a nonvolatile memory device 1100 and a controller 1200.

The nonvolatile memory device 1100 may be at least one of nonvolatile memory devices according to the exemplary embodiments of the present inventive concept described with reference to FIGS. 1 to 11.

The controller 1200 is connected to a host and the nonvolatile memory device 1100. The controller 1200 may be configured to access the nonvolatile memory device 1100 in response to a request from the host. For example, the controller 1200 may be configured to control read, write, erase, and background operations of the nonvolatile memory device 1100. The controller 1200 may be configured to provide an interface between the nonvolatile memory device 1100 and the host. Further, the controller 1200 may be configured to drive firmware to control the nonvolatile memory device 1100.

The controller 1200 may further include constituent elements, such as a random access memory (RAM), a central processing unit, a host interface, and a memory interface. The RAM is used as at least one of an operating memory of the central processing unit, a cache memory between the nonvolatile memory device 1100 and the host, and a buffer memory between the nonvolatile memory device 1100 and the host. The processing unit controls the overall operation of the controller 1200.

The host interface includes protocols for performing data exchange between the host and the controller 1200. Exemplarily, the controller 1200 is configured to communicate with an external device (e.g., host) through at least one of various interface protocols, such as a universal serial bus (USB) protocol, a multimedia card (MMC) protocol, a peripheral component interconnection (PCI) protocol, a PCI-express (PCI-E) protocol, an advanced technology attachment (ATA) protocol, a serial-ATA protocol, a parallel-ATA protocol, a small computer small interface (SCSI) protocol, an enhanced small disk interface (ESDI) protocol, and an integrated drive electronics (IDE) protocol. The memory interface interfaces with the nonvolatile memory device 1100. For example, the memory interface includes a NAND interface or a NOR interface.

The memory system 1000 may be configured to additionally include an error correction block. The error correction block is configured to detect and correct an error of data read from the nonvolatile memory device 1100 using an error correction code (ECC). Exemplarily, the error correction block may be provided as a constituent element of the nonvolatile memory device 1100.

The controller 1200 and the nonvolatile memory device 1100 may be integrated into one semiconductor device. For example, the controller 1200 and the nonvolatile memory device may be integrated into one semiconductor device to configure a memory card, such as a PC card ((e.g., personal computer memory card international association (PCMIA)), a compact flash (CF) card, a smart media card (SM or SMC), a memory stick, a multimedia card (MMC, reduced size (RS)-MMC, MMCmicro), a secure digital card (SD, miniSD, microSD, or secure digital high capacity (SDHC)), a universal flash storage device (UFS), or the like.

The controller 1200 and the nonvolatile memory device 1100 may be integrated into one semiconductor device to configure a solid state drive (SSD). The SSD includes a storage device that is configured to store data in a semiconductor memory. In the case where the memory system 1000 is used as the SSD, the operating speed of the host that is connected to the memory system 1000 can be improved.

As another example, the memory system 1000 may be provided as one of various constituent elements of electronic devices, such as a computer, an ultra mobile PC (UMPC), a work station, a net-book, a personal digital assistant (PDA), a portable computer, a web tablet, a wireless phone, a mobile phone, a smart phone, an e-book, a portable multimedia player (PMP), a portable game machine, a navigation device, a black box, a digital camera, a 3D television receiver, a digital audio recorder, a digital audio player, a digital picture recorder, a digital picture player, a digital video recorder, a digital video player, a device that can transmit and receive information in a wireless environment, one of various electronic devices constituting a home network, one of various electronic devices constituting a computer network, one of various electronic devices constituting a telematics network, a radio frequency identification (RFID) device, or one of various constituent elements constituting a computing system.

Exemplarily, the nonvolatile memory device 1100 or the memory system 1000 may be mounted as various types of packages. For example, the nonvolatile memory device 1100 or the memory system 1000 may be packaged and mounted as package on package (PoP), ball grid array (BGA), chip scale package (CSP), plastic leaded chip carrier (PLCC), plastic dual in line package (PDIP), die in waffle pack, die in wafer form, chip on board (COB), ceramic dual in line package (CERDIP), plastic metric quad flat pack (MQFP), thin quad flat pack (TQFP), small outline integrated circuit (SOIC), shrink small outline package (SSOP), thin small outline package (TSOP), system in package (SIP), multi chip package (MCP), wafer-level fabricated package (WFP), wafer-level processed stack package (WSP), or the like.

Figure 23:
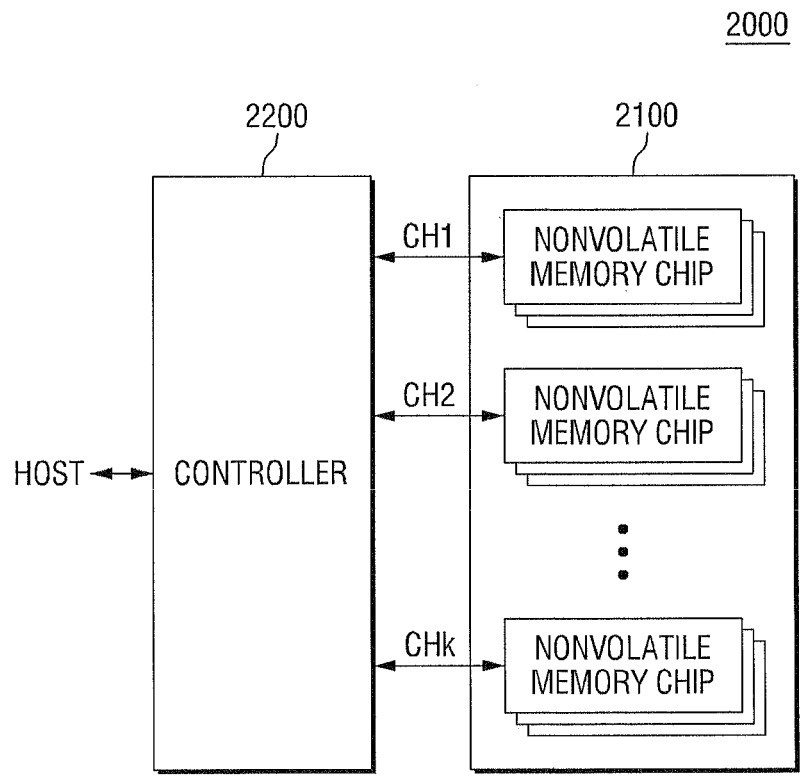
FIG. 23 is a block diagram illustrating an application example of the memory system of FIG. 22.

FIG. 23 is a block diagram illustrating an application example of the memory system of FIG. 22.

Referring to FIG. 23, a memory system 2000 includes a non-volatile memory device 2100 and a controller 2200. The nonvolatile memory device 2100 includes a plurality of nonvolatile memory chips. The plurality of memory chips are divided into a plurality of groups. The respective groups of the plurality of nonvolatile memory chips are configured to communicate with the controller 2200 through one common channel. For example, it is illustrated that the plurality of nonvolatile memory chips communicate with the controller 2200 through first to k-th channels CH1 to CHk.

The respective nonvolatile memory chips may be configured in the same manner as the nonvolatile memory device as described above with reference to FIGS. 1 to 11.

In FIG. 23, it is described that the plurality of nonvolatile memory chips are connected to one channel. However, it is understood that the memory system 2000 can be modified so that one nonvolatile memory chip is connected to one channel.

Figure 24:
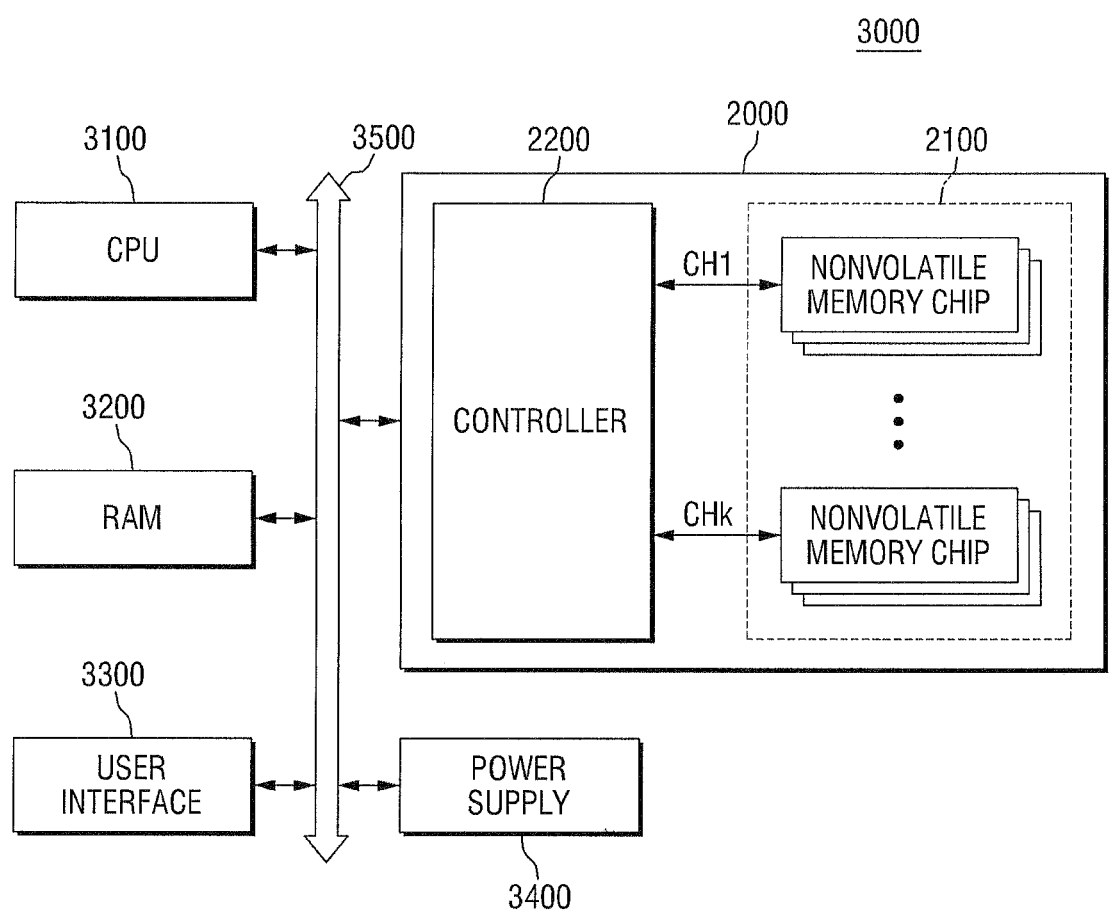
FIG. 24 is a block diagram illustrating a computing system that includes the memory system of FIG. 23.

FIG. 24 is a block diagram illustrating a computing system that includes the memory system as described above with reference to FIG. 23.

Referring to FIG. 24, a computing system 3000 includes a central processing unit 3100, a RAM 3200, a user interface 3300, a power supply 3400, and a memory system 2000. The memory system 2000 is electrically connected to the central processing unit 3100, the RAM 3200, the user interface 3300, and the power supply 3400 through a system bus 3500. Data which is provided through the user interface 3300 or is processed by the central processing unit 3100 is stored in the memory system 2000.

FIG. 24 illustrates that a nonvolatile memory device 2100 is connected to the system bus 3500 through the controller 2200. However, the nonvolatile memory device 2100 may be configured to be directly connected to the system bus 3500.

FIG. 24 illustrates that the memory system 2000 as described above with reference to FIG. 23 is provided. However, the memory system 2000 may be replaced by the memory system 1000 as described above with reference to FIG. 22.

Exemplarily, the computing system 3000 may be configured to include all the memory systems 1000 and 2000 as described above with reference to FIGS. 22 and 23.

While the present inventive concept has been particularly shown and described with reference to exemplary embodiments thereof, it will be understood by those of ordinary skill in the art that various changes in form and details may be made therein without departing from the spirit and scope of the present inventive concept as defined by the following claims.

What is claimed is:

1. A nonvolatile memory device, comprising:
a substrate including a cell array region and a connection region;
an electrode structure formed on the cell array region and the connection region and including a plurality of laminated electrodes, wherein the plurality of laminated electrodes include wordlines;
a first recess formed in the electrode structure on the connection region and disposed between the cell array region and a second recess formed in the electrode structure on the connection region; and
a plurality of vertical wirings formed on the plurality of electrodes exposed by the first recess,
wherein the first recess includes first wordlines forming a first side wall surface of the first recess and second wordlines forming a second side wall surface of the first recess, the second sidewall surface facing the first sidewall surface, and the second recess includes third wordlines forming a third side wall surface of the second recess and fourth wordlines forming a fourth side wall surface of the second recess, the fourth sidewall surface facing the third side wall surface,
wherein the plurality of vertical wirings are formed on the first wordlines at the first sidewall surface, and the plurality of vertical wirings are not formed on the second wordlines at the second sidewall surface, the third wordlines at the third sidewall surface and the fourth wordlines at the fourth sidewall surface.

2. The nonvolatile memory device of claim 1, wherein the plurality of electrodes exposed by the first recess have a step shape.

3. The nonvolatile memory device of claim 1, further comprising a plurality of channel patterns that penetrate the electrode structure on the cell array region.

4. A semiconductor memory device, comprising:
a first electrode structure formed on a substrate and including a plurality of electrodes;
a first recess formed in the first electrode structure and having first and second slanted walls opposite each other;
a second recess formed in the first electrode structure adjacent to the first recess, the second recess having third and fourth slanted walls opposite each other; and
a plurality of vertical wirings formed on the electrodes along the first slanted wall in the first recess and not formed on the electrodes along the second slanted wall in the first recess, and the third and fourth slanted walls in the second recess.

5. The semiconductor memory device of claim 4, wherein the second recess is a dummy recess.

6. The semiconductor memory device of claim 4, wherein the electrodes include word lines.

7. The semiconductor memory device of claim 4, wherein the electrodes have a step shape.

8. The semiconductor memory device of claim 4, wherein the semiconductor memory device is a nonvolatile memory device.

* * * * *